(12) United States Patent
Kejik et al.

(10) Patent No.: US 7,834,620 B2
(45) Date of Patent: Nov. 16, 2010

(54) ORTHOGONAL FLUXGATE MAGNETIC FIELD SENSOR

(75) Inventors: Pavel Kejik, Ecublens (CH); Ozge Zorlu, Lausanne (CH)

(73) Assignee: Liaisons Electroniques-Mecaniques Lem SA, Plan-Les-Ouates (CH)

( * ) Notice: Subject to any disclaimer, the term of this patent is extended or adjusted under 35 U.S.C. 154(b) by 390 days.

(21) Appl. No.: 11/989,184

(22) PCT Filed: Jul. 17, 2006

(86) PCT No.: PCT/IB2006/002007
§ 371 (c)(1),
(2), (4) Date: Jan. 22, 2008

(87) PCT Pub. No.: WO2007/010378
PCT Pub. Date: Jan. 25, 2007

(65) Prior Publication Data
US 2009/0230955 A1 Sep. 17, 2009

(30) Foreign Application Priority Data
Jul. 22, 2005 (EP) .................................. 05405451

(51) Int. Cl.
*G01R 33/04* (2006.01)
(52) U.S. Cl. ...................................................... 324/253
(58) Field of Classification Search .................. 324/244, 324/247, 249, 253, 254, 255
See application file for complete search history.

(56) References Cited

U.S. PATENT DOCUMENTS

| 3,218,547 A | 11/1965 | Ling |
| 3,718,872 A * | 2/1973 | Takeushi ..................... 332/173 |
| 6,194,897 B1 | 2/2001 | Fukunaga |
| 6,690,164 B1 | 2/2004 | Fedeli et al. |
| 2004/0232913 A1 * | 11/2004 | Schott et al. ................. 324/253 |

FOREIGN PATENT DOCUMENTS

EP  1 293 792 A  3/2003

OTHER PUBLICATIONS

International Search Report for PCT/IB2006/002007 issued by the European Patent Office on Nov. 11, 2006.

* cited by examiner

*Primary Examiner*—Kenneth J Whittington
(74) *Attorney, Agent, or Firm*—Baker & Daniels LLP

(57) ABSTRACT

Orthogonal fluxgate sensor for measuring an external magnetic field Hext, comprising a conductor for carrying an excitation current Iexc, a ferromagnetic material adapted to saturate in the presence of a magnetic field generated by the excitation current, and at least one pick-up coil adapted to detect variations in the magnetic field in the vicinity of the magnetic material. The excitation conductor comprises a substantially linear elongated portion of conductive, non-magnetic material, forming an excitation rod (6). The magnetic material surrounds the excitation rod in the form of a cladding (8).

7 Claims, 6 Drawing Sheets

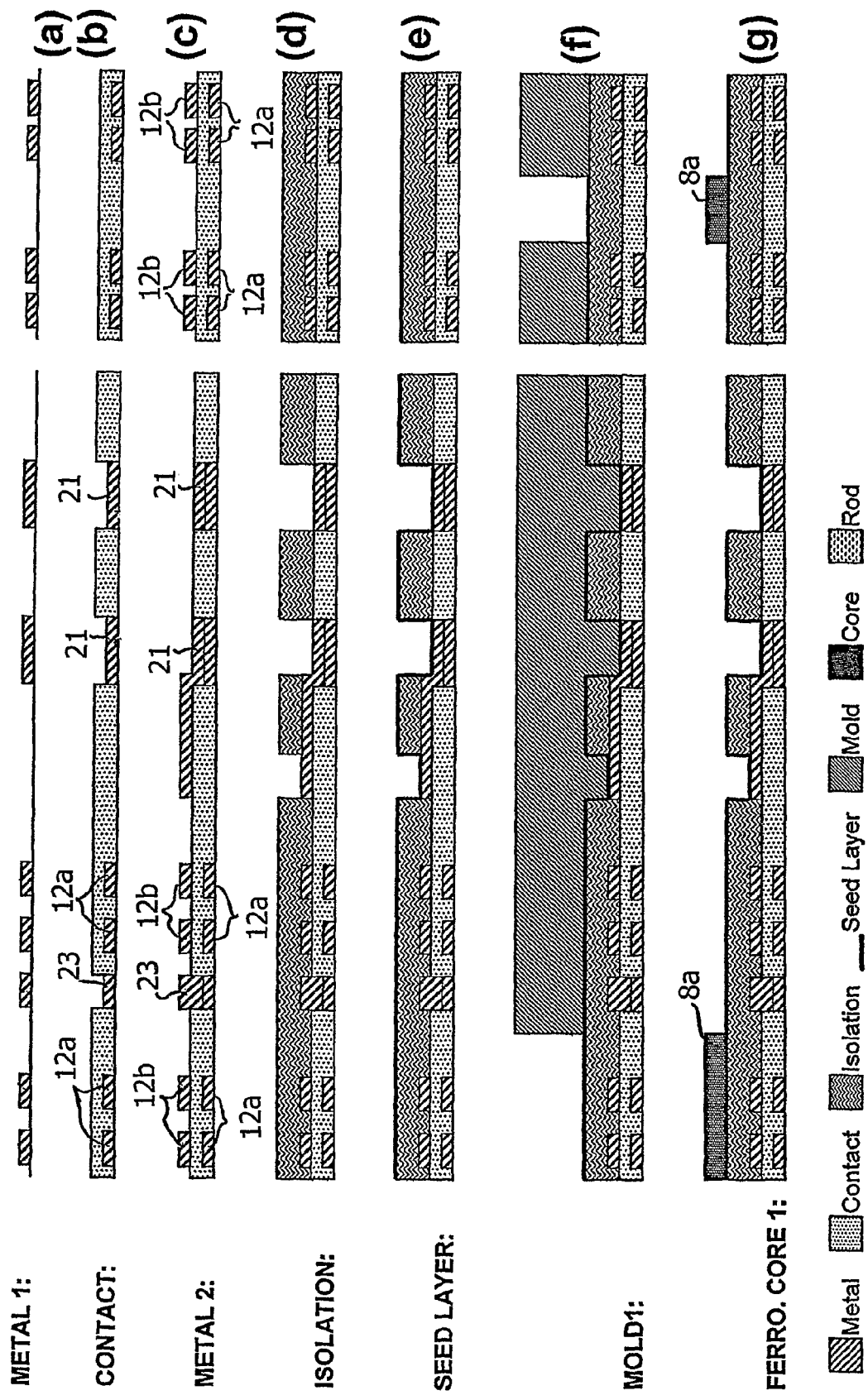

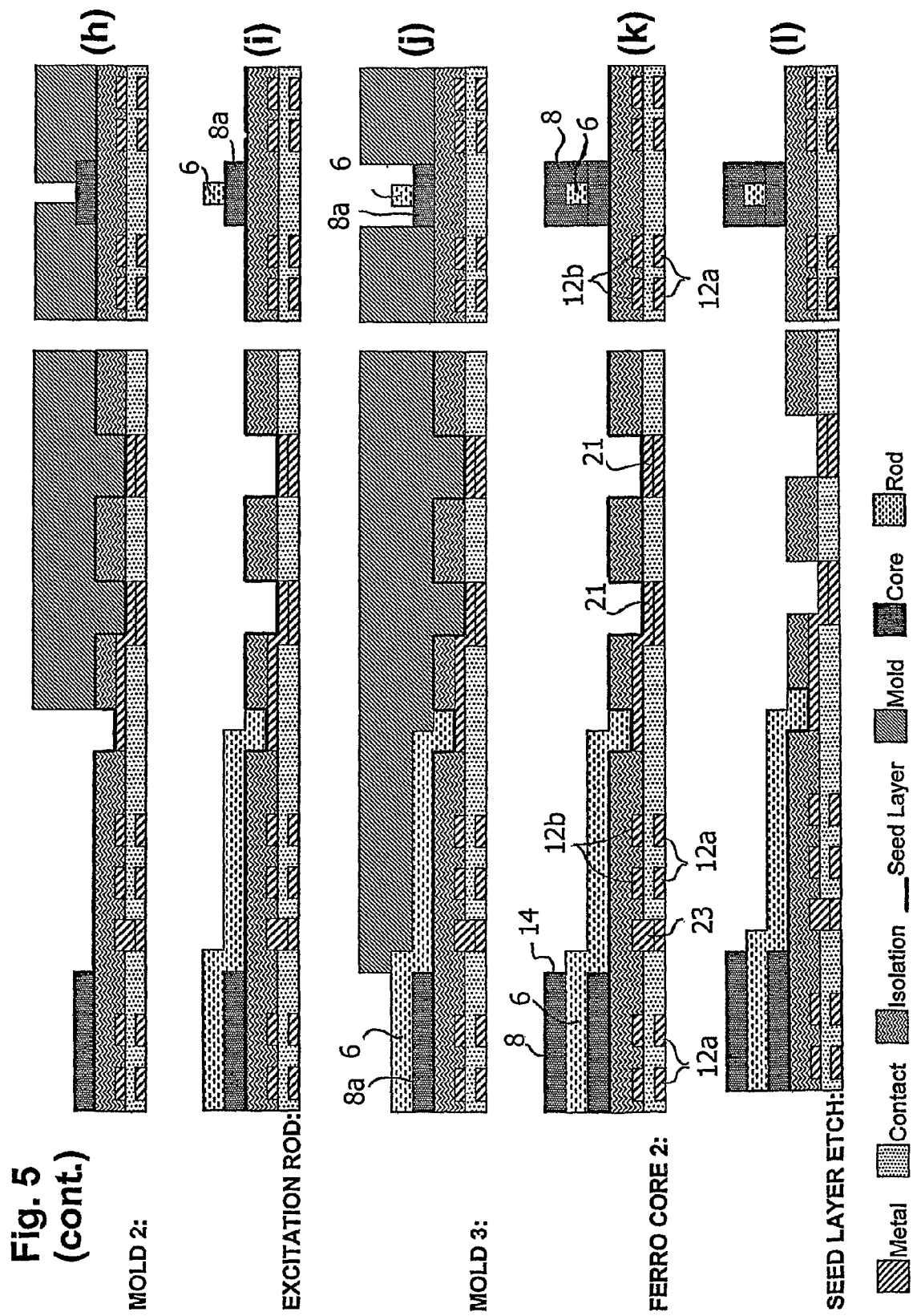

ORTHOGONAL FLUXGATE MAGNETIC FIELD SENSOR

BACKGROUND

The present invention relates to an integrated orthogonal fluxgate magnetic sensor and method of the fabrication thereof.

There is generally a need in many applications for a low-cost miniature magnetic field sensor to measure a weak magnetic field with certain precision. Fluxgates are the most popular, high sensitivity magnetic sensors built using an easily saturable ferromagnetic core. Fluxgate type magnetic sensors may be used for magnitudinal and directional measurement of DC or low-frequency AC magnetic fields. Typical applications are electronic compasses, current sensors, magnetic ink reading, detection of ferrous materials, and non-destructive testing [1, 2]. The main advantage of fluxgate sensors are their high sensitivity and very low offset. On the other hand, low magnetic field operation range and high perming are problems in current fluxgate sensors [3].

The working principle of fluxgate sensors based on the periodic saturation of ferromagnetic material with an AC excitation field and to detect the change in the flux passing through the core, which is proportional to the external magnetic field. Two kinds of configurations in fluxgates are generally known: a parallel fluxgate, having the excitation field parallel to the measured field, and an orthogonal fluxgate with the excitation field perpendicular to the measured field.

In order to simplify the manufacturing, only one ferromagnetic core combined with coils can be used as a fluxgate sensor. When only one ferromagnetic core is used, the orthogonal fluxgate configuration is preferable because of better signal treatment dynamic of the fluxgate sensor. The magnetic field to be measured is physically decoupled from the excitation field by placing the sensing coil to the orthogonal position with respect to the excitation field. The contribution of the excitation field is then removed from the measured signal [6].

FIG. 1 illustrates an orthogonal configuration of a conventional single-core fluxgate sensor. The circular excitation magnetic field Hexc is orthogonal to the axis of the core (C) and consequently to the external applied magnetic field Hext. Such an arrangement decouples the sensing coil (S) from the excitation coil (E).

The conventional orthogonal fluxgate sensor shown in FIG. 1 is however costly to manufacture, particularly in view of the need to wind the excitation coil around the ferromagnetic core, a portion of the coil being fed through the central cavity provided in the core. Winding of the sensing coil around the core is also not particularly cost effective. The excitation coil winding also limits the practical length thereof. The construction also limits the degree of miniaturization and the possibilities of integration of the sensor in miniaturized electronic devices.

In view of the foregoing, several technologies have been developed in order to integrate the fluxgate sensor in a compact and cost effective arrangement. The planar configurations as described in [7], [8] or [9] use always an open-core structure in parallel configuration and differential mode, with the following characteristics:

- two ferromagnetic cores or two parts of one ferromagnetic core,
- magnetized in longitudinal direction of the core,
- two cores magnetized in opposite directions—differential mode,
- core dimensions (core length over core section area) and magnetic properties of the core determinate at once the sensor resolution and the requirements on excitation field performances,
- the excitation of the core and/or the detection of the measured field is performed by the 3D micro machined coils enclosing the core, or planar coils situated under the core and fabricated by using the metallization in CMOS technology.

Such known configurations of integrated fluxgate sensors, while being compact and cost effective to manufacture in large series, have the following drawbacks:

- The use of two ferromagnetic cores relatively complicates the sensor configuration and occupies more space.
- The open-core structure is not magnetized thoroughly along the whole length of the core. The core center saturates first, the tips of the core as the last. The tips of the core never achieve the deep saturation and it creates perming of the sensor (i.e. memory effect of the sensor to the hard magnetic shocks).
- Limitation of the core dimensions for detection and excitation fields. The shorter the core, the wider the measuring range is at variance with the excitation condition, however the shorter the core, the more difficulty there is to generate a magnetic field with sufficient strength to saturate the core along the whole length. Therefore, the core length influences in opposite directions the measuring range and the excitation arrangement.
- The use of planar coils for both excitation and detection leads to a closely coupled coil structure. Such a structure creates huge capacitive and magnetic parasitic signals compared to the measured signal. This disturbing signal deteriorates the sensor signal to noise ratio and stability.

SUMMARY OF THE INVENTION

An object of this invention is to provide an orthogonal fluxgate sensor that is compact, cost effective to manufacture in industrial series, and that demonstrates good performance, in particular a wide measuring range, low perming effect, and high precision.

It would be further advantageous to provide an orthogonal fluxgate sensor that can be cost effectively integrated in an integrated circuit and that is easy to drive and control.

It would be advantageous to provide an orthogonal fluxgate sensor that has low power consumption.

Objects of this invention have been achieved by providing the orthogonal fluxgate magnetic field sensor according to claim 1.

Disclosed herein is an orthogonal fluxgate magnetic field sensor comprising an excitation conductor made of a non-magnetic conducting material, a saturable magnetic material, and at least one pick-up coil, wherein the excitation conductor comprises an essentially linear portion in the form of a rod, clad therealong and therearound by the saturable magnetic material. The one or more pick-up coils are preferably arranged adjacent ends of the ferromagnetic cladding. The ferromagnetic cladding may be in direct contact with the excitation conductor without insulation therebetween.

Preferably, the ferromagnetic cladding and excitation conductor may be formed by deposition and etching of layers that are built up to form an integrated structure, such as a LiGA process with copper electroplating and etching for non-magnetic conductor formation, and ferromagnetic permalloy deposition for the cladding. The layers may be built up on a silicon substrate in which the sensor drive and control electronic circuit is also integrated, such as a case of a CMOS process.

Advantageously, the sensor configuration according to the invention significantly decreases the sensor size and footprint and can be manufactured by integrated circuit layer build-up processes, whereby the sensor drive and signal processing circuitry may be directly provided in the semiconductor substrate to provide a very compact, low cost and low power consuming magnetic field sensor.

A further important advantage of the sensor according to the invention is the even saturation of the ferromagnetic cladding surrounding the center excitation conductor over the entire length of the cladding. In addition, the length of the center excitation conductor and cladding can be varied easily from one sensor design to another, in order to change the sensitivity and operating range of the sensor without any significant changes to the manufacturing process.

It is also advantageous that the excitation conductor and sensing coils are separately driven, and independent, thereby ensuring high sensor signal to noise ratio and stability.

A single conducting rod going through the center of the saturable ferromagnetic cladding drastically decreases the required semiconductor surface occupied by the excitation mechanism, compared with prior integrated fluxgate sensors containing planar excitation coils.

An excitation current $I_{exc}$, fed via electric contacts, for example realized by electroplating and flowing along the center conducting layer, produces a circular magnetic field $H_{exc}$. The longitudinal magnetic permeability (i.e. in the direction parallel to the measuring field) is therefore modulated by the circular magnetic field $H_{cir}$, perpendicular to the measuring field. Two sensing elements represented by the pick-up coils or alternatively by Hall plate elements positioned below opposite longitudinal ends of the ferromagnetic cladding are used for the detection of an alternating magnetic field that is proportional to the external magnetic field $H_{ext}$.

The cross-section shape of the ferromagnetic cladding and the central excitation conductor is preferably square or circular, but may have other forms.

In order to keep the level of excitation current low and saturate all parts of the ferromagnetic core, the perimeter of the ferromagnetic core is preferably reduced down to minimum size allowed by the layer deposition technology. The center of the each portion of pick-up coil is located under the longitudinal end of the ferromagnetic cladding where the field concentration in the direction perpendicular to the substrate is the highest.

The ferromagnetic cladding, the sensing coil and the substrate are isolated from each other by non-conducting, non-magnetic material. The electrical isolation between the central excitation conductor and the ferromagnetic cladding is not necessary, but could be provided, if desired.

High linearity of the microsensor can be achieved by introducing a feedback configuration to the system. Either planar coils positioned under the ferromagnetic structure or an external discrete coil around the microsensor is the element generating the compensation field. The planar coil for the feedback can be the same as that for the signal sensing.

This magnetic sensor can be combined with an electronic circuit made in CMOS technology. The electronics may advantageously provide all the necessary signals for excitation, signal detection and feedback.

The different direction of the circular excitation $H_{cir}$ from the longitudinal measured field $H_{ext}$, to which the cylindrical ferromagnetic structure is exposed, is very advantageous. First, since the orthogonal configuration of fluxgate sensor is used, the contribution of the excitation field is removed from the measured signal. Secondly, in case of circular excitation the magnetic structure has a closed path and the ferromagnetic cladding layer with apparent permeability μa equal to intrinsic permeability μi is directly exposed to the circular excitation field $H_{cir}$. Consequently, the level of the excitation field $H_{cir}$ necessary to reach the cladding saturation stays unchanged while changing the length I of the ferromagnetic cladding. Therefore, the length I of the structure has no impact on the excitation mechanism. Since an external magnetic field in longitudinal direction is applied, the effect of the length I has to be taken into account and the demagnetizing factor Nd [5] determined by structure dimensions tends to reduce the apparent permeability $\mu_a$ of the structure in longitudinal direction. The measuring range of the sensor can thus easily be adjusted by simply changing the excitation conductor and cladding structure length I.

The excitation rod is coated with the ferromagnetic material in a way that a circular magnetic excitation field loop is formed inside the ferromagnetic material. The permeability of the ferromagnetic layer is periodically modulated in the orthogonal direction with respect to the measured magnetic field by passing an AC current through the excitation rod. This makes the detection part independent of the excitation mechanism and the measuring range and the sensitivity can be adjusted by modifying only the cladding length. The modification of the core length changes the demagnetization factor [5] of the core. The apparent relative permeability μapp of the core deviates from its intrinsic value according to the demagnetization factor. This can be expressed as:

$$\mu_{app} = \frac{\mu_i}{1 + N(\mu_i - 1)} \quad (1)$$

where $\mu_i$ is the intrinsic relative permeability and N is the demagnetization factor. A change in the apparent permeability produces a change in the linear region of the B-H curve of the ferromagnetic cladding layer. Since the saturation magnetic filed intensity $B_{sat}$ remains constant, the slope of the linear region decreases and the magnetic field H required to saturate the material increases. This corresponds to a decrease in the sensitivity, but also to an increase in the linear operating range of the sensor. This phenomenon is effective in the longitudinal direction in the sensor, i.e. in the sensing direction of the magnetic field.

On the other hand, in the radial direction, i.e. in the excitation direction the geometry can be considered as an infinitely long magnetic material core due to the closed magnetic loop, for which the demagnetization factor is zero. So, the slope of the B-H curve is a maximum, which allows easy and homogenous saturation along the whole cladding length. The preferably two planar coils, one positioned under each extremity of the ferromagnetic cladding, pick up the measured signal. The use of planar pick-up coils advantageously provides easy integration into standard CMOS processes.

BRIEF DESCRIPTION OF THE DRAWINGS

FIG. 2a is a view in perspective of an embodiment of an orthogonal fluxgate magnetic field sensor according to this invention;

FIG. 2b is an exploded cross-sectional view through lines IIb-IIb of FIG. 2a;

FIG. 2c is a detailed view in cross-section of a central excitation conductor and ferromagnetic cladding of the sensor according to the invention;

FIG. 5 shows, in cross-section, the successive steps (a) to (l) of build-up of layers to manufacture a portion of the sensor according to the invention.

DETAILED DESCRIPTION OF EMBODIMENTS OF THE INVENTION

Figure 1:
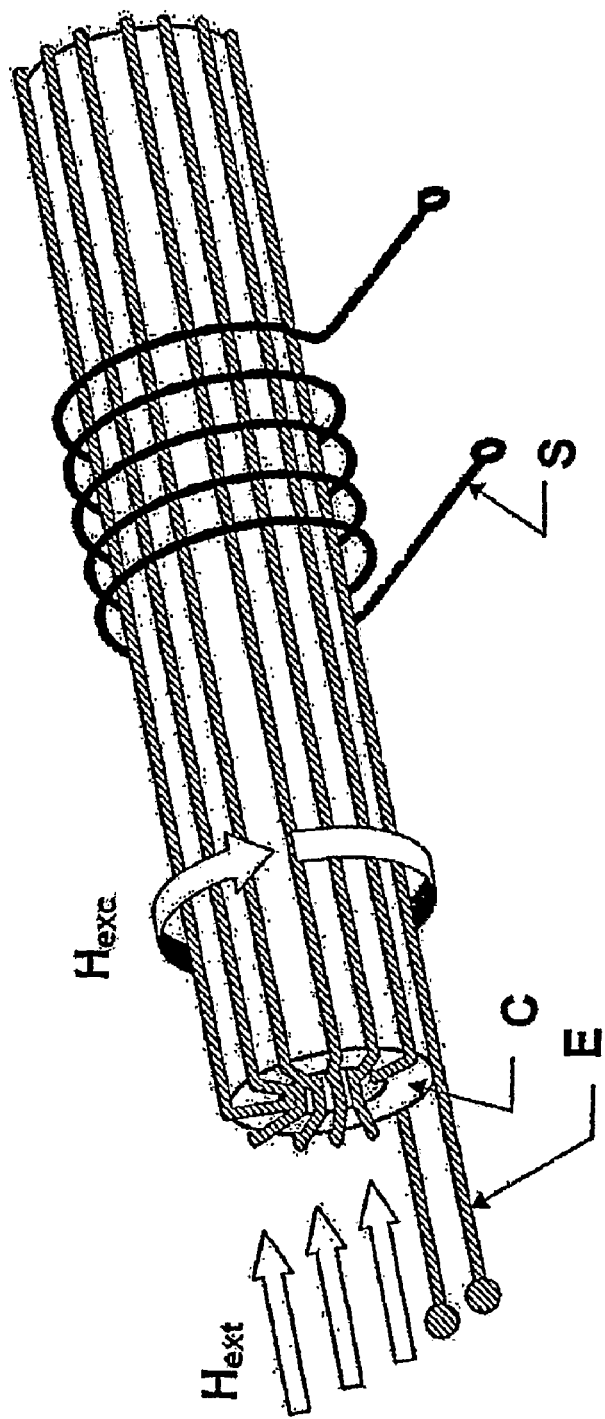
FIG. 1 is a view in perspective of a prior art orthogonal fluxgate magnetic field sensor.
Figure 2:
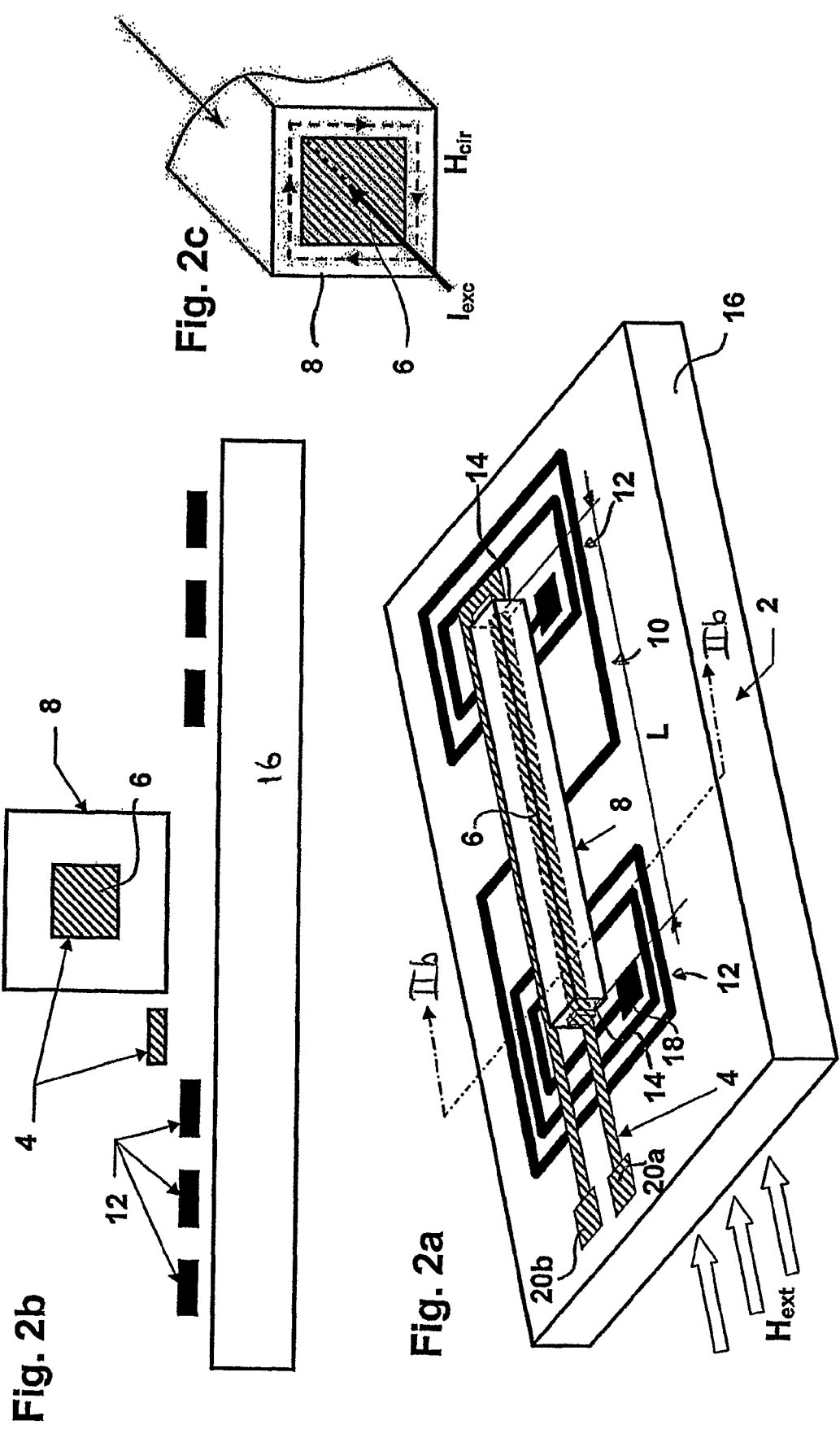

Referring to the Figures, in particular FIGS. 2a to 2c, an orthogonal fluxgate magnetic field sensor 2, according to this invention, comprises an excitation conductor 4 having an essentially linear portion 6, hereinafter referred to as "excitation rod" clad with a saturable ferromagnetic cladding 8, and a sensor pick-up coil 10 having coil portions 12 arranged adjacent opposed ends 14 of the saturable ferromagnetic cladding 8. The sensor further comprises a substrate 16 on which the cladding 8 and excitation conductor 4 are mounted.

The substrate 16 may be made of a ceramic, glass or other insulating material. Preferably however, the substrate 16 is made of a semi-conductor material comprising an integrated circuit including the pick-up coil 10 and connected to the excitation conductor 4. Exemplary embodiments of circuits that may be integrated in the semiconductor are illustrated in the block diagrams of FIGS. 4a and 4b, that will be described further on.

In an embodiment where the substrate 16 acts as a support without integrated circuit, the sensing coil and excitation conductor may be provided with respective conducting pads 18, 20 (see FIG. 2a) for bonding to electrical conductors connected to an external signal processing and excitation circuit. Where the substrate 16 comprises an integrated circuit, as schematically illustrated by the layer 16a in FIG. 3, ends 20 of the excitation conductor may be directly interconnected to the circuit by vias 21 created during layer deposition of the conductor. Likewise, the interconnections of the pick-up coil between different layers, respectively to the circuit, may be performed through vias or contact points 23.

The substrate 16 with integrated circuit 16a may be made of other known semiconductor technologies, such as CMOS, in which case the semiconductor layer with integrated circuit and metallic conducting layers forming the pick-up coils could be directly integrated in the substrate resulting in an integrated circuit composed of 16a, 15 and 13, the magnetic material and excitation conductor being deposited thereon. An example of the manufacturing procedure will be described further on.

The sensing coil 10 is preferably planar, whereby the coil portions 12 have their centers approximately situated at respective ends 14 of the ferromagnetic cladding 8. This ensures the maximum pick-up of the external magnetic field orthogonal to the plane of the substrate due to the bending of the external magnetic field lines into the ferromagnetic cladding, the concentration being greatest at the extremities 14.

Figure 3:
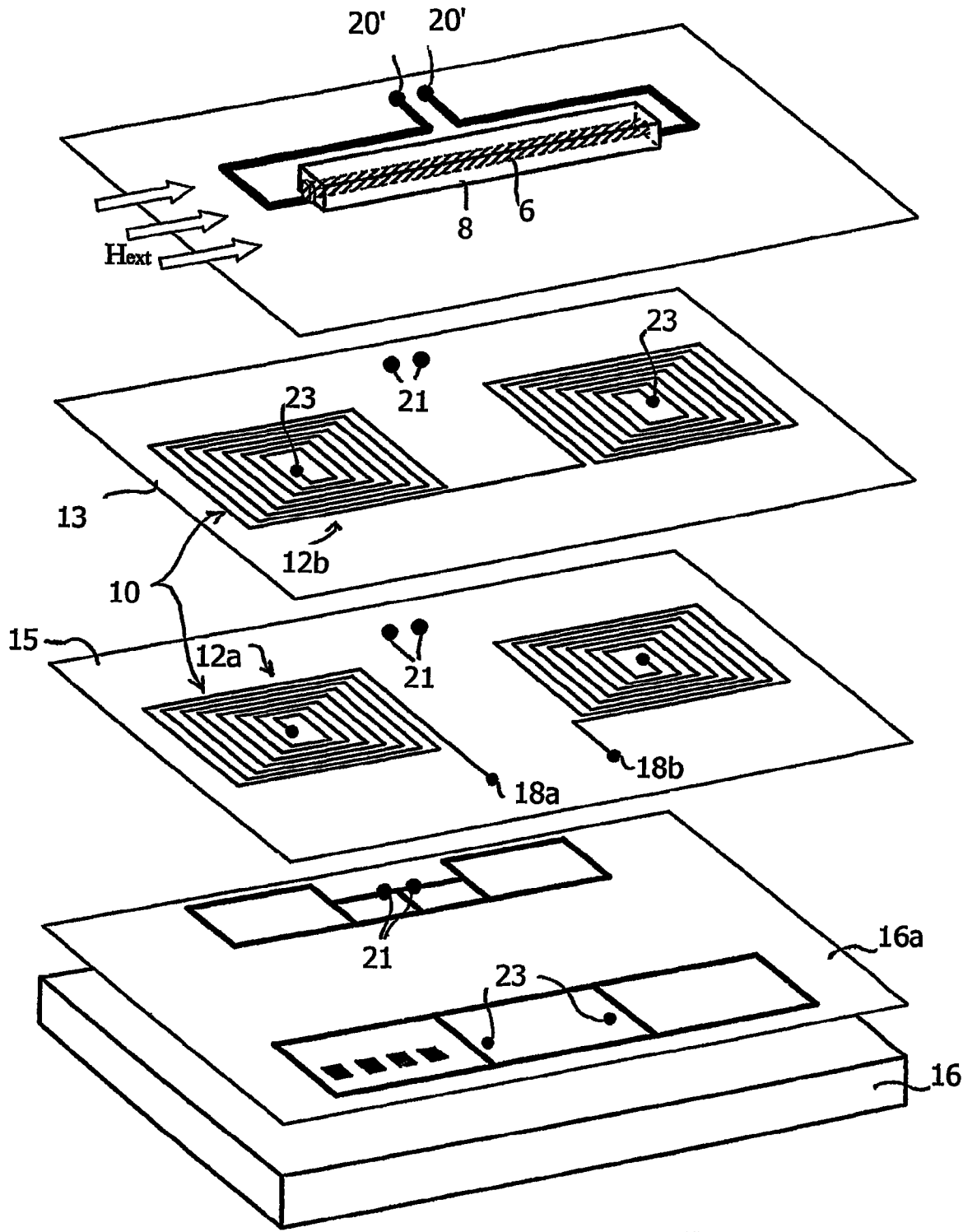
FIG. 3 is an exploded perspective view of an embodiment of an orthogonal magnetic fluxgate according to this invention.

In order to increase the pick-up sensitivity, each coil portion 12 may be formed of two sets of spirals 12a, 12b provided on two stacked layers 13, 15, as shown in FIG. 3, thereby doubling the number of turns of the sensing coil. Since two layers would normally be required for the sensing coil in order to route the connection points 18 outside of the center of the coils for practical purposes, the additional coil does not add any layers and therefore does not complicate the manufacturing process. Yet further layers could be added, if greater measuring sensitivity is required.

The cladding 8 is preferably formed of a ferromagnetic material such as a material commonly known as "permalloy", although other soft magnetic materials that are easily saturable and that have low hysteresis may be used. The advantage of ferromagnetic materials is that they are easy to deposit in an advantageous manufacturing method for building the sensor according to this invention. The material used for the excitation conductor portion and the pick-up coil is preferably copper, or copper alloy, although other non-magnetic materials with good conductive properties may be used.

Figure 4A:
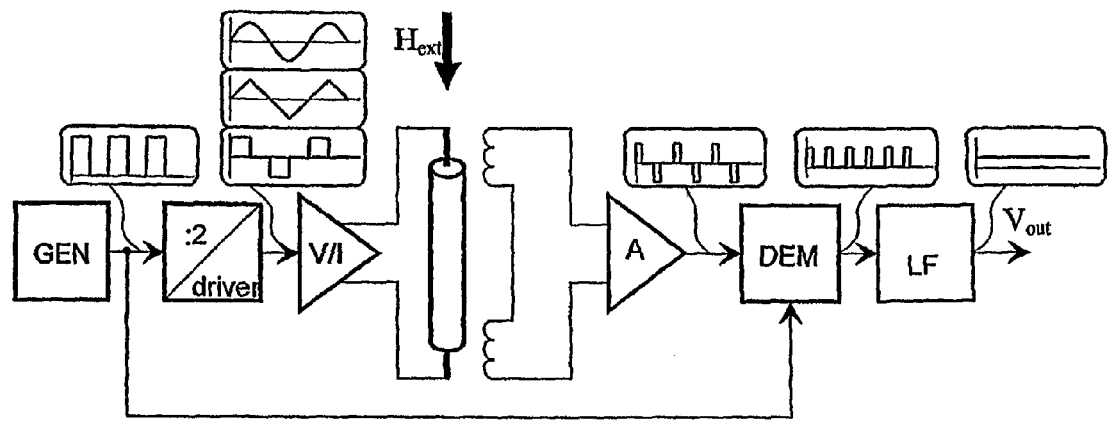
FIG. 4a is a circuit block diagram illustrating a circuit for driving the excitation current and processing the sensor pick-up signals.

Referring to FIG. 4a, a first embodiment of the signal processing circuit operating in direct mode will now be briefly described. A clock signal Clk with a frequency $f_o$, is generated by a generator GEN. The frequency of the signal is divided by 2 and the signal is converted by the driver into a voltage waveform having only odd harmonics and zero offset such as a sinusoidal, triangular, or pulsed waveform. This voltage waveform is converted into a current waveform and fed to the excitation rod of the ferromagnetic core. The level of the current waveform must be high enough to saturate the ferromagnetic core. This periodic saturation produces an induced voltage proportional to the external magnetic field $H_{ext}$, across the terminals of the pick-up coils placed below the edges of the core. The induced voltage is amplified and synchronously rectified by the demodulator DEM. Then the resulting signal is fed to a low pass filter with cut-off frequency lower than $f_o$. The output of the low pass filter is a DC voltage proportional to the external magnetic field $H_{ext}$ within the measuring range of the sensor.

Figure 4B:
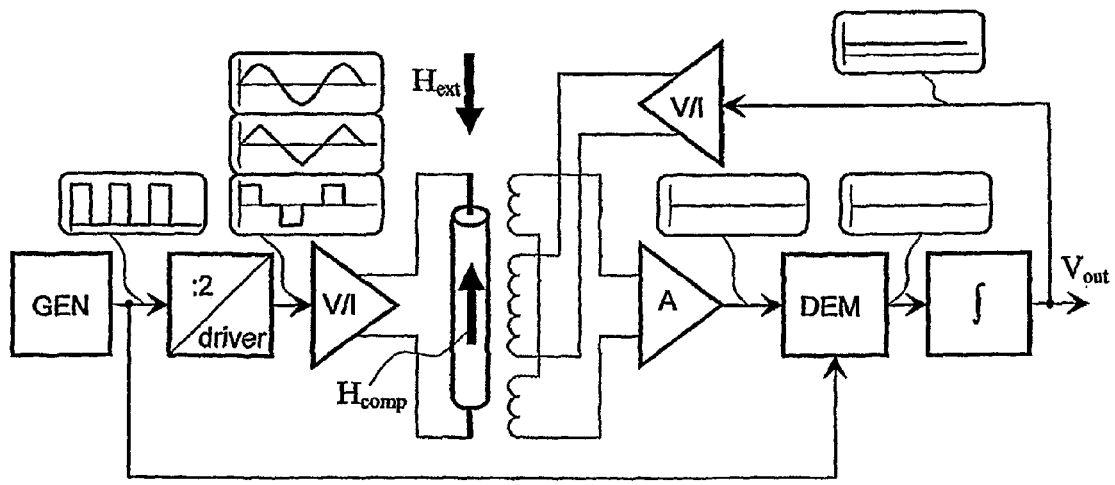
FIG. 4b is a circuit block diagram illustrating a circuit for driving the excitation current and for processing the sensor pick-up signals, with feed-back, according to another embodiment of this invention.

Referring to FIG. 4b, a second embodiment of the signal processing circuit operating with feedback will now be briefly described. A clock signal Clk with a frequency $f_o$, is generated by a generator GEN. The frequency of the signal is divided by 2 and the signal is converted by the driver into a voltage waveform having only odd harmonics and zero offset such as a sinusoidal, triangular, or pulsed waveform. This voltage waveform is converted into a current waveform and fed to the excitation rod of the ferromagnetic core. The level of the current waveform must be high enough to saturate the ferromagnetic core. This periodic saturation produces an induced voltage proportional to the external magnetic field $H_{ext}$, across the terminals of the pick-up coils placed below the edges of the core. The induced voltage is amplified and synchronously rectified by the demodulator DEM. Then the signal is integrated in an integrator and passed through a voltage to current converter. The resulting current is fed to the feedback coil which produces a compensating magnetic field $H_{comp}$ in the opposite direction of the external magnetic field $H_{ext}$, resulting in a decrease in the induced voltage across the terminals of the pick-up coils. When the system is stable, the current passing through the feedback coil produces the same level of the magnetic field as the external field, so that the total field around the core is zero and no voltage is induced across the pick-up coils. This makes the outputs of the amplifier and the demodulator also zero, and the output of the integrator is a DC voltage proportional to the external magnetic field $H_{ext}$.

FIG. 5 illustrates the sequence of steps in the build-up of layers in an example of the process steps in manufacturing a sensor according to the invention. The left hand section of FIG. 5 shows a representative longitudinal cross-section through the sensor layers, whereas the right hand sight is representative of a transverse cross-section.

In the first step (a), a lower layer of the pick-up coils 12a and contact pads 20 for the excitation rod are formed on the substrate by known metal deposition techniques such as sputtering, followed by photolithography and etching to form the pattern, whereby the deposited metal material is for example an aluminum alloy AlSi1%.

Subsequently, in step (b), a contact layer is deposited, for example $SiO_2$, by sputtering, followed by photolithography and etching, to form the patterns, in particular to free the vias 21,23 for interconnection of the two layers of the pick-up coil 12a, 12b, the second coil layer 12b being deposited in step (c) by the same techniques as in step (a).

In step (d), an insulating layer, for example SU-8, is deposited by spinning, followed by photolithography over which a seed layer for electroplating is deposited in step (e), for example Cr/Cu by evaporation.

In step (f), a mold [4], for example AZ9260, is deposited on the layers by spinning followed by photolithography, leaving exposed the openings required for forming a base portion 8a of the ferromagnetic cladding, for example Permalloy ($Fe_{19}Ni_{81}$), which is deposited by electroplating and the mold removed as shown in step (g).

In step (h), a further mold is is deposited by spinning followed by photolithography to allow formation of the conductive excitation rod 6 by electroplating copper and subsequently removing the mold as shown in step (i). The excitation rod is connected to vias 21 for connection to the drive circuit.

In the subsequent step (j), a mold is is deposited by spinning followed by photolithography, around the partially formed ferromagnetic base layer 8a and the excitation rod 6 to allow electroplating of the remaining part of the ferromagnetic cladding 8 around the excitation rod, as shown in step (k). In the last step (l), the seed layer remaining exposed is removed by etching.

In case CMOS technology is used, the pick-up coil may already be integrated in the integrated circuit, in other words, the equivalent of steps (a) to (d) would already be integrated in the CMOS fabrication technology, the additional process steps starting from creation of the seed layer from step (e) onwards.

REFERENCES

[1] F. Kaluza, A. Gruger, H. Gruger, "New and future applications of fluxgate sensors," Sensors & Actuators A 106, pp: 48-51, 2003.

[2] P. Ripka, "Advances in fluxgate sensors," Sensors & Actuators A 106, pp: 8-14, 2003.

[3] Pavel Ripka, "Magnetic Sensors and Magnetometers", Artech House Publishers, January, 2001.

[4] J. M. Quemper, et. al, "Permalloy electroplating through photoresist molds," Sensors & Actuators A74, pp. 1-4, 1999.

[5] J. A. Osborn, "Demagnetizing Factors for the General Ellipsoid," Physical Review, Vol. 67, No. 11-12, June 1-15, pp. 351-357, 1945.

[6] F. Primdahl, "The fluxgate magnetometer", J. Phys. E: Sci. Instrum., vol. 12, pp. 241-253, 1979.

[7] S. O. Choi, S. Kawahito, Y. Matsumoto, M. Ishida and Y. Tadokoro "An integrated micro fluxgate magnetic sensor", Sensors and Actuators A: Physical, Volume 55, Issues 2-3, 31 Jul. 1996, Pages 121-126

[8] R. Gottfried-Gottfried, W. Budde, R. Jähne, H. Kück, B. Sauer, S. Ulbricht and U. Wende, "A miniaturized magnetic-field sensor system consisting of a planar fluxgate sensor and a CMOS readout circuitry", Sensors and Actuators A: Physical, Volume 54, Issues 1-3, June 1996, Pages 443-447

[9] L. Chiesi, P. Kejik, B. Janossy and R. S. Popovic "CMOS planar 2D micro-fluxgate sensor", Sensors and Actuators A: Physical, Volume 82, Issues 1-3, 15 May 2000, Pages 174-180

The invention claimed is:

1. Orthogonal fluxgate sensor for measuring an external magnetic field $H_{ext}$, comprising a conductor for carrying an excitation current $I_{exc}$, a saturable magnetic material adapted to saturate in the presence of a magnetic field generated by the excitation current, and at least one pick-up coil (10) adapted to detect variations in the magnetic field in the vicinity of the magnetic material, wherein the excitation conductor comprises a substantially linear elongated portion of conductive, non-magnetic material, forming an excitation rod (6), the magnetic material surrounding the excitation rod in the form of a cladding (8) and wherein the pick-up coil comprises at least two layers of planar spirals (12a, 12b) stacked one of top of the other.

2. Sensor according to claim 1, wherein the ferromagnetic cladding is deposited around the excitation rod and in direct contact therewith.

3. Sensor according to claim 1, wherein the pick-up coil, ferromagnetic cladding, and excitation conductor are built up on a substrate (16, 16a) in layers formed by deposition and patterning.

4. Sensor according to claim 3, wherein the sensor further comprises a circuit for driving the excitation current and processing the pick-up coil signals, integrated in the substrate.

5. Sensor according to claim 4, wherein the processing circuit and pick-up coils are integrated in a CMOS process, on which the ferromagnetic cladding and excitation rod are built up.

6. Sensor according to claim 1, wherein the pick-up coil comprises at least two coil portions, one at each longitudinal end (14) of the ferromagnetic cladding.

7. Sensor according to claim 6, wherein centers of the respective pick-up coil portions are positioned adjacent said longitudinal ends of the ferromagnetic cladding.

* * * * *